(12) United States Patent
Reul et al.

(10) Patent No.: US 9,170,008 B2
(45) Date of Patent: Oct. 27, 2015

(54) DISK HAVING AN ILLUMINATED SWITCH SURFACE

(71) Applicant: SAINT-GOBAIN GLASS FRANCE, Courbevoie (FR)

(72) Inventors: Bernhard Reul, Herzogenrath (DE); Klaus Schmalbuch, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/348,003

(22) PCT Filed: Oct. 4, 2012

(86) PCT No.: PCT/EP2012/069558
§ 371 (c)(1),
(2) Date: Mar. 27, 2014

(87) PCT Pub. No.: WO2013/053629
PCT Pub. Date: Apr. 18, 2013

(65) Prior Publication Data
US 2014/0233240 A1 Aug. 21, 2014

(30) Foreign Application Priority Data
Oct. 10, 2011 (EP) .................................... 11184476

(51) Int. Cl.
*F21V 23/04* (2006.01)
*H03K 17/96* (2006.01)

(52) U.S. Cl.
CPC .............. *F21V 23/04* (2013.01); *H03K 17/962* (2013.01); *H03K 2217/960785* (2013.01); *Y10T 29/49105* (2015.01)

(58) Field of Classification Search
None
See application file for complete search history.

(56) References Cited

U.S. PATENT DOCUMENTS

| 5,239,152 A | * | 8/1993 | Caldwell et al. ............... 200/600 |
| 5,594,222 A | * | 1/1997 | Caldwell ....................... 200/600 |
| 6,452,514 B1 | | 9/2002 | Philipp |
| 2003/0210537 A1 | | 11/2003 | Engelmann |
| 2011/0001420 A1 | * | 1/2011 | Tchakarov et al. ........... 313/355 |
| 2014/0042467 A1 | * | 2/2014 | Livesay et al. .................. 257/88 |

FOREIGN PATENT DOCUMENTS

| DE | 202006006192 | 7/2006 |
| DE | 102006022965 | 11/2007 |
| EP | 0899882 | 3/1999 |
| EP | 1515211 | 3/2005 |
| EP | 1544178 | 6/2005 |
| WO | 2008022866 | 2/2008 |
| WO | 2009037131 | 3/2009 |

OTHER PUBLICATIONS

Written Opinion mailed on Nov. 29, 2012 for PCT/EP2012/069558 filed on Oct. 4, 2012 in the name of Saint-Gobain Glass France, original German, translation English.

* cited by examiner

*Primary Examiner* — Ashok Patel
(74) *Attorney, Agent, or Firm* — Steinfl & Bruno LLP

(57) ABSTRACT

A disk having an illuminated switch surface is described. The disk has a transparent substrate, an electrically conductive structure, which forms a switch surface, a flat conductor, which is electrically connected to the electrically conductive structure by means of an electrical connecting element, a light-irradiation means, which has at least one light source and is arranged on the flat conductor and on a lateral edge of the substrate. Light is coupled into the disk from the lateral edge of the substrate and from a light-refracting means, which is arranged in the region of the disk irradiated by the light of the light-irradiation means.

22 Claims, 7 Drawing Sheets

DISK HAVING AN ILLUMINATED SWITCH SURFACE

CROSS REFERENCE TO RELATED APPLICATIONS

Figure 1:
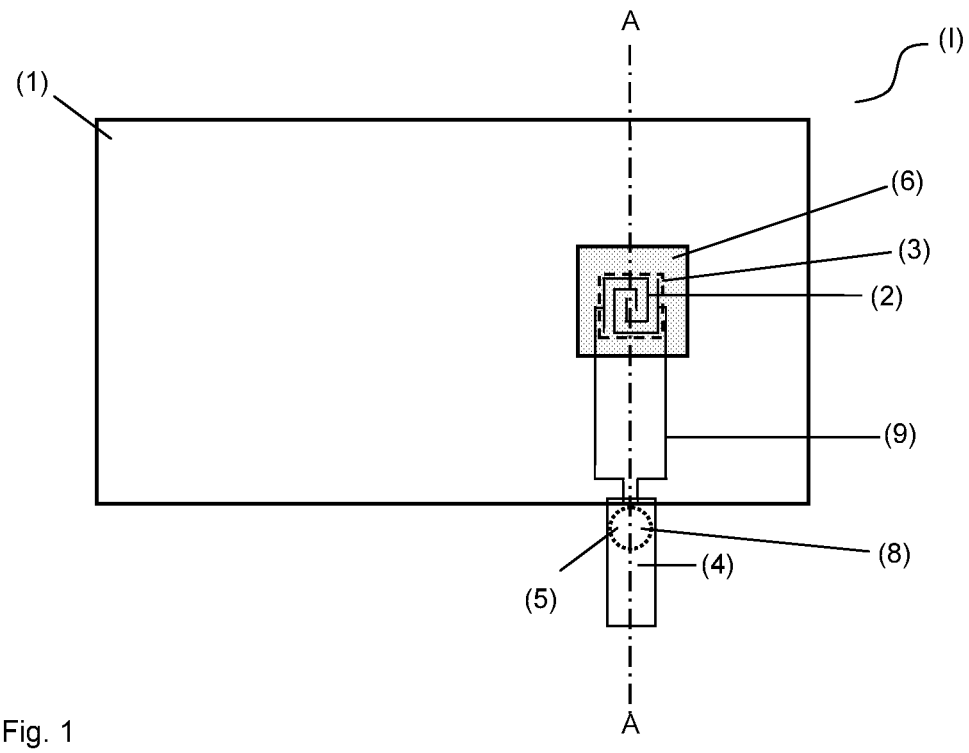

The present application is the US national stage of International Patent Application PCT/EP2012/069558 filed on Oct. 4, 2012 which, in turn, claims priority to European Patent Application EP 11184476.7 filed on Oct. 10, 2011.

The invention relates to a pane having an illuminated switch surface, a method for its production, and its use.

It is known that switch surfaces can be formed by a surface electrode or by an arrangement of two coupled electrodes, for example, as capacitive switch surfaces. When an object approaches the switch surface, the capacitance of the plate electrode changes against ground or the capacitance of the condenser formed by the two coupled electrodes changes. The capacitance change is measured by a circuit arrangement and when a threshold value is exceeded, a switching signal is triggered. Circuit arrangements for capacitive switches are known, for example, from DE 20 2006 006 192 U1, EP 0 899 882 A1, U.S. Pat. No. 6,452,514 B1, and EP 1 515 211 A1.

The electrode or the electrodes can be applied directly on a pane made of glass or another transparent material, which is known, for example, from EP 1 544 178 A1. The switch surface can thus be integrated without any additional structural elements into a glazing. However, the switch surface is difficult or impossible to discern. Moreover, the switch surface cannot be felt in the dark. Consequently, the position of the switch surface must be marked, with the marking, in particular, having to be perceptible even in the dark. Lighting elements such as LEDs can, for example, be integrated into the glazing around the switch surface or applied on the glazing. This disadvantageously impacts the visual appearance of the glazing. Moreover, the lighting elements, as additional structural components inside the glazing or on the surface of the glazing make the production and maintenance of the glazing more difficult. Alternatively, the switch surface can be illuminated by an external light source. A complex and error-prone adjustment of the external light source is required. Besides that, the illumination of the switch surface can be easily interrupted, for example, by a user.

The object of the present invention is to make available a pane with an integrated switch surface and a method for its production, wherein the position of the switch surface is identified without bothersome structural elements, in particular in the dark.

The object of the present invention is accomplished according to the invention by a pane having an illuminated switch surface in accordance with the independent claim 1. Preferred embodiments emerge from the dependent claims.

The pane according to the invention having an illuminated switch surface comprises the following characteristics:
- a transparent substrate,
- an electrically conductive structure, which forms a switch surface,
- a flat conductor, which is electrically connected to the electrically conductive structure via an electrical connecting element,
- a light irradiation means, which comprises at least one light source and is arranged on the flat conductor and on a lateral edge of the substrate, wherein light from the lateral edge of the substrate is coupled into the pane,
- a light deflection means, which is arranged in the region of the pane irradiated by the light of the light irradiation means, wherein the area that results from a projection of the light deflection means onto the plane of switch surface is arranged within the switch surface and/or borders the switch surface continuously or interruptedly.

The light of the light irradiation means is coupled via the lateral edge of the substrate into the pane according to the invention. The light of the light irradiation means thus enters into the pane according to the invention via the lateral edge of the substrate. A region of the pane is irradiated by the coupled-in light. The region of the pane irradiated by the light is determined by the radiation characteristic of the light irradiation means. The substrate typically has a higher refractive index than the surroundings of the pane. The coupled-in light is reflected on the surfaces of the substrate according to the principle of total reflection into the interior of the substrate. Alternatively, the coupled-in light is totally reflected on the surfaces of further layers connected to the substrate facing away from the substrate, which have a refractive index similar to that of the substrate, and reflected into the interior of the pane. Light that strikes the light deflection means at the time of passage through the pane is not totally reflected, but, instead, leaves the pane, preferably by scattering on the light deflection means. The region of the light deflection means is, consequently, perceived by an observer as illumating surface on the pane.

According to the invention, the lighted surface on the pane advantageously identifies the position of the switch surface through the positioning of the light deflection means relative to the switch surface. By means of the design according to the invention with the switch surface and the light deflection means, which are integrated into the pane, and the light irradiation means, which is arranged on the lateral edge of the substrate, an advantageously low thickness of the pane having an illuminated switch surface is achieved. The thickness corresponds substantially to the thickness of the substrate and any other glazing layers bonded to the substrate. In addition, the pane is simple and economical to produce, and the switch surface, the light deflection means, and the light irradiation means are durably stably arranged relative to each other. These are major advantages of the present invention.

The light deflection means and the switch surface can be arranged in spatially different planes. Here, "plane" refers to a surface that is formed parallel to the surface of the pane. The light deflection means is, according to the invention, arranged such that the area that results from the projection of the light deflection means onto the plane of the switch surface is arranged within the switch surface and/or borders the switch surface continuously or interruptedly. Here, an orthogonal projection of the light deflection means is performed, wherein the projection plane is the same plane in which the switch surface is arranged. The projection plane can also be spanned by a curved surface, in particular in the case of a curved pane according to the invention.

The light deflection means preferably comprises structures for light scattering. These structures are particularly preferably particles, point grids, stickers, deposits, indentations, scratches, line grids, imprints, and/or silkscreen prints. The light deflection means can form a single continuous surface. Alternatively, the light deflection means can form two or more surfaces separated from each other.

The light deflection means can have any desired shape that is suited to mark the position of the switch surface. The light deflection means can, for example, have a simple two-dimensional geometric shape, such as a circle, an ellipse, a triangle, a rectangle, a square, or any other type of quadrilateral, a higher polygon, or combinations thereof. The geometric figure can be filled over its entire surface with the light deflection means. Alternatively, the light deflection means can be arranged along the edge of the geometric figure continuously or interruptedly. The light deflection means can even have a shape that describes the function that is controlled by the switch, for example, a "plus" or "minus" sign, one or a plurality of letters and/or numbers, or a pictogram. The light deflection means can also have the shape of another graphic symbol, for example, a company or trademark symbol. The light deflection means can also have a shape that results from a combination of the examples mentioned, for example, a circumferential circular edge around a pictogram.

The surface area of the surface that results from a projection of the light deflection means onto the plane of the switch surface is preferably from 5% to 300%, particularly preferably from 10% to 200% and very particularly preferably from 20% to 150% of the surface area of the switch surface. This is particularly advantageous with regard to a clear and unambiguous identification of the position of the switch surface on the pane according to the invention by light scattered on the light deflection means.

The surface that results from the projection of the light deflection means onto the plane of the switch surface can be arranged completely within the switch surface. The surface area of the surface that results from the projection of the light deflection means onto the plane of the switch surface is preferably smaller than the surface area of the switch surface. Thus, the position of the switch surface is advantageously identified by the lighted surface on the pane, with even touching the pane in a region adjacent the lighted area still resulting in triggering a switch operation.

Alternatively, the surface area of the surface that results from the projection of the light deflection means onto the plane of the switch surface can be equal to the surface area of the switch surface. The surface that results from the projection of the light deflection means onto the plane of the switch surface and the switch surface are, in that case, preferably identical or virtually identical. Thus, the position of the switch surface is advantageously identified by the lighted surface on the pane. Touching the lighted surface on the pane results in triggering a switch operation.

In an alternative advantageous embodiment of the invention, the surface area of the surface that results from the projection of the light deflection means onto the plane of the switch surface is greater than the surface area of the switch surface. A first region of the surface that results from the projection of the light reflection means onto the plane the switch surface preferably completely overlaps the switch surface. A second region of the surface that results from the projection of the light deflection means onto the plane of the switch surface borders the switch surface. Since, to trigger a switching operation, a user intuitively touches the inner region of the lighted surface on the pane, the position of the switch surface is advantageously identified.

In an alternative advantageous embodiment of the invention, the switch surface is bordered by the surface that results from the projection of the light deflection means onto the plane of the switch surface. The border can be designed continuously or interruptedly and can have, for example, a width from 0.2 to 2 cm, roughly 1 cm. The surface that results from the projection of the light deflection means onto the plane of the switch surface and the switch surface do not overlap each other or only overlap in the edge region of the switch surface. Since, to trigger a switch operation, a user intuitively touches the region on the pane bordered by the lighted surface, the position of the switch surface is advantageously identified.

In an alternative advantageous embodiment, the light deflection means comprises a first and a second region that are not connected to each other. The surface that results from the projection of the first region of the light deflection means onto the plane of the switch surface borders the switch surface continuously or interruptedly. The surface that results from the projection of the second region of the light deflection means onto the plane of the switch surface is arranged completely within the switch surface. The first region of the light deflection means can, for example, be formed as a circumferential circular edge. The second region of the light deflection means can, for example, be formed as a symbol or a pictogram. Thus, the position of the switch surface is advantageously identified by the lighted surface on the pane.

The substrate preferably contains prestressed, partially prestressed, or non-prestressed glass, particularly preferably flat glass, float glass, quartz glass, borosilicate glass, soda lime glass, or clear plastics, in particular polyethylene, polypropylene, polycarbonate, polymethyl methacrylate, polystyrene, polyamide, polyester, polyvinyl chloride, and/or mixtures thereof.

The thickness of the substrate can vary widely and thus be ideally adapted to the requirements of the individual case. The substrate preferably has a thickness from 1 mm to 10 mm and particularly preferably from 2 mm to 7 mm. The area of the substrate can vary widely, for example, from 100 cm$^2$ to 18 m$^2$. Preferably, the substrate has an area from 400 cm$^2$ to 4 m$^2$, such as is common for glazings of motor vehicles and of structural and architectural glazings.

The substrate can have any three-dimensional shape. The substrate is preferably flat or slightly or greatly curved in one or a plurality of spatial directions.

The switch surface is preferably a capacitive switch surface. In an advantageous embodiment, the electrically conductive structure forms a plate electrode. The capacitance of the plate electrode is measured by external control electronics. The capacitance of the plate electrode changes against ground when a grounded body comes into its proximity or, for example, touches an insulator layer above the plate electrode. The change in capacitance is measured by the control electronics; and when a threshold value is exceeded, a switching signal is triggered. The switch surface is defined by the shape and size of the plate electrode.

In an alternative advantageous embodiment, the electrically conductive structure forms two electrodes that are capacitively coupled to each other. The electrodes can, for example, have spiral, comb-like, or meandering shapes. The capacitance of the condenser formed by the electrodes changes upon approach of a body. The change in capacitance is measured by the control electronics; and when a threshold value is exceeded, a switching signal is triggered. The switch surface is defined by the shape and size of the region in which the electrodes are capacitively coupled.

Alternatively, the switch surface can also have inductive, thermal, or all other sensor functions that are contact free. "Contact free" means that no direct touching of the electrically conductive structure is necessary to trigger a switch operation. Of course, the switch function is also effective with direct touching of the electrically conductive structure, if the electrically conductive structure is accessible to the user. In principle, even switch surfaces with contact-dependent sensor functions can be identified according to the invention.

The switch surface is integrated into the pane according to the invention. Thus, no switch that has to be installed on the pane as a separate component is necessary. The pane according to the invention, which can be implemented as a single plane or as a composite pane, preferably also has no other components that are arranged in the see-through region on its surfaces. This is particularly advantageous with regard to a thin design of the pane as well as the transparency of the pane, in particular the transparency of the switch surface.

The switch surface preferably has an area from 1 cm$^2$ to 200 cm$^2$, particularly preferably from 1 cm$^2$ to 10 cm$^2$. The switch surface can, for example, have the shape of an oval, an ellipse, or a circle, a triangle, a rectangle, a square or a different type of quadrilateral, or a higher polygon.

The electrically conductive structure can be produced by printing or burning in a conductive paste. The conductive paste preferably contains silver particles and glass frits. The layer thickness of the burned-in paste is preferably from 5 μm to 40 μm, particularly preferably from 8 μm to 20 μm. The burned-in silver paste itself has a light scattering characteristic and can itself, consequently, advantageously serve as a light deflection means.

Alternatively, the electrically conductive structure can be formed by insulation regions in an electrically conductive coating on the substrate or on a layer bonded to the substrate. The electrically conductive coating contains, for example, silver, zinc oxide, indium tin oxide, tin oxide, gallium, gold, copper, tungsten, and/or mixtures thereof. The electrically conductive coating preferably has a layer thickness from 5 nm to 1 μm, particularly preferably from 10 nm to 500 nm. The insulation regions can be formed, for example, by removal of the coating by laser ablation or mechanical abrasion or by electrical separation lines completely surrounding the insulation region. Two capacitively coupled electrodes preferably have conductor tracks with a width from 5 μm to 5 mm, particularly preferably from 10 μm to 2 mm. The insulation regions preferably have a width from 5 μm to 5 mm, particularly preferably from 10 μm to 2 mm. Particularly good results are thus obtained.

Alternatively, the electrically conductive structure can be realized by preferably very thin wires that are hardly perceptible visually.

In an advantageous embodiment of the invention, the substrate is a single-pane safety glass. The electrically conductive structure can be arranged on the same surface of the substrate as the light deflection means. The electrically conductive structure can be arranged out of the direction of the substrate above or below the light deflection means or in the same plane as the light deflection means. Alternatively, the electrically conductive structure and the light deflection means can be arranged on the opposite surfaces of the substrate.

Other layers can be arranged between the substrate and the electrically conductive structure, between the substrate and the light deflection means, and/or between the electrically conductive structure and the light deflection means. Other layers can be arranged on the side of the electrically conductive structure or the light deflection means facing away from the substrate, for example, for protection against damage. The electrically conductive structure and/or the light deflection means can also be applied on a carrier film bonded to the substrate.

In another advantageous embodiment, the substrate is part of a composite pane, in particular a laminated safety glass. The substrate is bonded by at least one intermediate layer to at least one cover pane. The intermediate layer preferably contains at least one thermoplastic plastic, such as polyvinyl butyral (PVB) or ethylene vinyl acetate (EVA) or a plurality of layers thereof, preferably with thicknesses from 0.3 mm to 0.9 mm. Particularly good results are thus obtained.

The cover pane preferably contains prestressed, partially prestressed, or non-prestressed glass, particularly preferably flat glass, float glass, quartz glass, borosilicate glass, soda lime glass, or clear plastics, in particular polyethylene, polypropylene, polycarbonate, polymethyl methacrylate, polystyrene, polyamide, polyester, polyvinyl chloride, and/or mixtures thereof. The cover pane preferably has a thickness from 1 mm to 10 mm and particularly preferably from 1.5 mm to 7 mm.

The electrically conductive structure can be applied on a surface of the substrate. Alternatively, the electrically conductive structure can be applied on the surface of the cover pane facing the substrate or facing away from the substrate.

The light deflection means can be applied on a surface of the substrate. Alternatively, the light deflection means can be applied on the surface of the cover pane facing the substrate or facing away from the substrate.

The electrically conductive structure and the light deflection means are preferably arranged on one of the surfaces of the substrate and/or of the cover pane facing the intermediate layer. Thus, the electrically conductive structure and the light deflection means are advantageously protected against damage.

The electrically conductive structure and/or the light deflection means can be applied on a carrier film. The carrier film preferably contains at least one polyester and/or one polyimide, particularly preferably a thermoplastic polyester, for example, polyethylene naphthalate (PEN) or polyethylene terephthalate (PET). This is particularly advantageous with regard to the stability and workability of the carrier film. In a particularly preferred embodiment, the electrically conductive structure and the light deflection means are applied on the carrier film. The particular advantage resides in a simple common positioning of the electrically conductive structure and the light deflection means during production of the laminated safety glass. The carrier film is arranged between the substrate and the cover pane. The carrier film is bonded to the light deflection means, and the electrically conductive structure is particularly preferably bonded to the substrate by at least one first intermediate layer and to the cover pane by at least one second intermediate layer. The thickness of the carrier film is preferably from 10 μm to 1 mm, particularly preferably from 30 μm to 200 μm. In this range of thickness, the carrier film is advantageously stable and readily workable. The length and width of the carrier film can be equal to the length and width of the substrate. The length and width of the carrier film can also be smaller than the length and width of the substrate.

The pane according to the invention preferably has a transparent see-through region. This means that an observer can perceive objects through the see-through region of the pane. The switch surface as well as the light deflection means are preferably arranged in the see-through region of the pane. Preferably, no large-area opaque components are arranged in the see-through region. The flat conductor is preferably arranged completely outside the see-through area of the pane. Thus, vision through the pane is not impaired by the flat conductor.

The light irradiation means comprises, according to the invention, at least one light source, preferably an LED or OLED. The particular advantage resides in the small dimensions and the low power consumption. The wavelength range emitted by the light source can be freely selected in the visible light range, for example, based on practical and/or aesthetic considerations. The light irradiation means can comprise optical elements, in particular for deflection of the light, preferably a reflector and/or an optical waveguide, for example, a glass fiber or a polymeric optical fiber.

The light irradiation means is preferably arranged laterally offset relative to the substrate on the lateral edge of the substrate. Thus, an advantageously space-saving, thin design of the pane according to the invention is obtained. The distance between the light irradiation means and the lateral edge of the substrate is preferably less than or equal to 10 mm, particularly preferably less than or equal to 5 mm, quite particularly preferably less than or equal to 2 mm, and in particular less than or equal to 1 mm. Thus, an efficient coupling of the light of the light irradiation means into the pane via the lateral edge of the substrate is obtained.

The light irradiation means is arranged on the flat conductor and is preferably supplied with power via the flat conductor. The particular advantage resides in a space-saving design, as no additional components are required for the fastening of the light irradiation means on the pane and no independent power supply is required for the light irradiation means.

Fractions of the light coupled into the pane that strike a reflecting boundary surface at an angle of incidence that is smaller than the critical angle of the total internal reflection are not completely reflected into the interior of the pane, but, instead, advantageously leave the pane in the edge region in the vicinity of the light irradiation means. Thus, the decoupled fractions of the light do not have a disturbing effect on the observer and can also be simply masked, for example, by screen printing and/or frame elements.

The flat conductor (also referred to as ribbon cable or foil conductor) can comprise an electrically insulating sheathing, in addition to at least one electrically conductive core. The light irradiation means is preferably arranged on the sheathing and the light source is electrically connected to the conductive core. The light irradiation means is fixedly and durably stably connected to the flat conductor. The light irradiation means is thus durably stably affixed in the intended position with no additional fastening elements necessary.

The electrically conductive core of the flat conductor preferably consists of a strip of a metal or an alloy, for example, of copper, tinned copper, aluminum, gold, silver, and/or tin. The strip preferably has a thickness from 0.3 mm to 0.2 mm, for example, 0.1 mm, and a width from 2 mm to 16 mm. The insulating sheathing preferably contains plastic and is made, for example, of a plastic film with a thickness from 0.025 mm to 0.05 mm.

According to the invention, the electrically conductive structure is electrically connected to the flat conductor. The electrically conductive structure is preferably connected at least to a power supply and to external control electronics via the flat conductor. The control electronics are adapted to their respective use and can, in the triggering of a switch operation, trigger a mechanism for opening or closing a door or the heating of the pane.

The electrical connection between the flat conductor and each electrode formed by the electrically conductive structure is made according to the invention via an electrical connecting element. The electrical connecting element runs from the edge region of the surface on which the electrically conductive structure is applied all the way to the electrode formed by the electrically conductive structure. The flat conductor is connected to the electrical connecting element in the edge region of the pane according to the invention, preferably by soldering, clamping or, by means of an electrically conductive adhesive. Thus, in a manner that is simple and hardly visible to the user, the contacts are guided out of the pane or away from the pane. The edge region of the pane, in which the flat conductor is contacted with the electrical connecting element, can, for example, be masked by a frame, other fastening elements, or by a masking screenprint.

The edge region of the pane, in which the flat conductor is contacted with the electrical connecting element, preferably has a width less than or equal to 10 cm, particularly preferably less than or equal to 5 cm. The flat conductor runs from the edge region of the pane, in which it is contacted with the electrical connecting element, beyond the lateral edge of the pane away from the pane, in order to be connected to an external power supply. The flat conductor thus overlaps the surface of the substrate along a length of preferably a maximum of 10 cm, particularly preferably a maximum of 5 cm, for example, from 1 cm to 5 cm or from 2 cm to 3 cm. Thus, vision through the pane is advantageously little impaired by the flat conductor.

If the electrically conductive structure forms two electrodes coupled together, an electrical connecting element runs from each electrode to the edge region of the surface on which the electrically conductive structure is applied. The flat conductor preferably comprises, in this case, two electrically conductive cores separated from each other that are enclosed in a common electrically insulating sheathing. The two electrical connecting elements are connected in each case to an electrically conductive core of the flat conductor. Alternatively, two flat conductors are used for the contacting of the two electrical connecting elements.

The electrical connecting element is preferably realized by a printed or burned-in paste, by thin wires, or by insulation regions in an electrically conductive coating. Particularly preferably, the electrical connecting element is of the same type as the electrically conductive structure and is applied together with the electrically conductive structure.

In a preferred embodiment of the invention, the region of the flat conductor on which the light irradiation means is applied is arranged parallel or almost parallel to the surface of the substrate. The flat conductor is guided away from the pane according to the invention straight and without twists or bends. The particular advantage resides in stable positioning of the light irradiation means and prevention of damage to the flat conductors.

In an alternative preferred embodiment of the invention, the region of the flat conductor on which the light irradiation means is applied is arranged perpendicular or almost perpendicular to the surface of the substrate. In this case, the flat conductor is preferably curved or bent. This is particularly advantageous with regard to an efficient coupling of the light into the pane because the top side of the light source facing away from the flat conductor, via which light is typically emitted, is aimed at the lateral edge of the substrate. The fixing of the light irradiation means on the lateral edge of the substrate can, for example, be done by means of a transparent adhesive or a double-sided adhesive strip. Alternatively, the region of the flat conductor on which the light irradiation means is applied is fixed at the intended position, by means of another structural element, for example, a frame around the substrate or other fastening means.

In an advantageous embodiment of the invention, a plurality of light sources, preferably LEDs are arranged along the main axis of the flat conductor. In the region of the light sources, the flat conductor is guided along the lateral edge of the substrate, with the light of the light sources coupled via the lateral edge of the substrate into the pane. The particular advantage lies in an enlargement of the region of the pane irradiated by the light compared to the embodiment with a single light source. Thus, advantageously larger area light deflection means can be irradiated with light. Large-area light deflection means can, for example, act for identification of large-area switch surfaces or for identification of a switch field comprising a plurality of switch surfaces.

Alternatively, the light irradiation means can comprise a light source and an optical waveguide, with the flat conductor guided along the lateral edge of the substrate in the region of the optical waveguide and the light of the light source coupled into the optical waveguide. Thus, advantageously, larger area light deflection means can be irradiated with light.

The object of the invention is further accomplished by a method for producing a pane having an illuminated switch surface, wherein at least (a) an electrically conductive structure, which forms a switch surface, an electrical connecting element connected to the electrically conductive structure, and a light deflection means are applied on a transparent substrate are applied, and (b) a light irradiation means is arranged on a flat conductor and the flat conductor is electrically connected to the electrical connecting element, wherein the light irradiation means is arranged on a lateral edge of the substrate.

In process step (a), the electrically conductive structure and the electrical connecting element are applied on the same surface of the substrate. The light deflection means can be applied on the same surface of the substrate as the electrically conductive structure and the electrical connecting element or on the opposite surface of the substrate. The electrically conductive structure and the electrical connecting element can be applied before or after the light deflection means.

In process step (b), the arrangement of the light irradiation means on the flat conductor can occur before or after the electrical connection of the flat conductor and the electrical connecting element.

By means of suitable positioning of the electrical connecting element, the light irradiation means on the flat conductor is positioned on the lateral edge of the substrate such that the light deflection means is arranged in the region of the pane irradiated by the light of the light irradiation means. A complex adjustment of the position of the light irradiation means is not required. This is a particular advantage of the method according to the invention.

In an alternative embodiment, the electrically conductive structure and the electrical connecting element can be applied first and electrically connected to the flat conductor, and, thereafter, the light deflection means can be applied.

The object of the invention is further accomplished by a method for producing a pane having an illuminated switch surface, wherein at least (a) an electrically conductive structure, which forms a switch surface, and an electrical connecting element connected to the electrically conductive structure are applied on a transparent substrate or on a cover pane and a light deflection means is applied on the transparent substrate or on the cover pane, (b) a light irradiation means is arranged on a flat conductor and the flat conductor is electrically connected to the electrical connecting element, and (c) the substrate is bonded to the cover pane by at least one intermediate layer under the action of heat, vacuum, and/or pressure, wherein the light irradiation means is arranged on a lateral edge of the substrate.

In process step (a), the electrically conductive structure can be applied on the cover pane and the light deflection means on the substrate. Alternatively, the electrically conductive structure can be applied on the substrate and the light deflection means on the cover pane. Alternatively, the electrically conductive structure and the light deflection means can be applied on the cover pane. Alternatively, the electrically conductive structure and the light deflection means can be applied on the substrate. The electrical connecting element is applied on the same surface as the electrically conductive structure.

In process step (b), the arrangement of the light irradiation means on the flat conductor can be done before or after the electrical connection of the flat conductor and the electrical connecting element.

In an alternative embodiment, the arranging of the light irradiation means on the flat conductor can be done after the connecting of the substrate, the intermediate layer, and the cover pane.

The object of the invention is further accomplished by a method for producing a pane having an illuminated switch surface, wherein at least (a) an electrically conductive structure, which forms a switch surface, an electrically connecting element connected to the electrically conductive structure, and a light deflection means are applied on a carrier film, (b) a light irradiation means is arranged on a flat conductor and the flat conductor is electrically connected to the electrical connecting element, and (c) the carrier film is bonded to a substrate by a first intermediate layer and to a cover pane by a second intermediate layer under the action of heat, vacuum, and/or pressure, wherein the light irradiation means is arranged on a lateral edge of the substrate.

In an alternative embodiment, the arranging of the light irradiation means on the flat conductor can be done after the bonding of the substrate, the intermediate layers, and the cover panes.

In the method according to the invention, the positioning of the electrically conductive structure and of the light deflection means must be selected such the area that results from the projection of the light deflection means onto the plane of the switch surface is arranged within the switch surface and/or borders the switch surface continuously or interruptedly. The light irradiation means must be positioned on the lateral edge of the substrate such that the region of the pane irradiated by the light of the light irradiation means includes the light deflection means.

The invention also includes the use of the pane having an illuminated switch surface as a functional and/or decorative individual piece and/or as a built-in component in furniture and devices, in particular electronic devices with a cooling or heating function, for glazing of buildings, in particular in the access or window area, or for glazing in a motor vehicle for travel on land, in the air, or on water, in particular in automobiles, buses, streetcars, subways, and trains for passenger service and for public short and long distance travel, for example, as a motor vehicle door or in a motor vehicle door.

Figure 2:
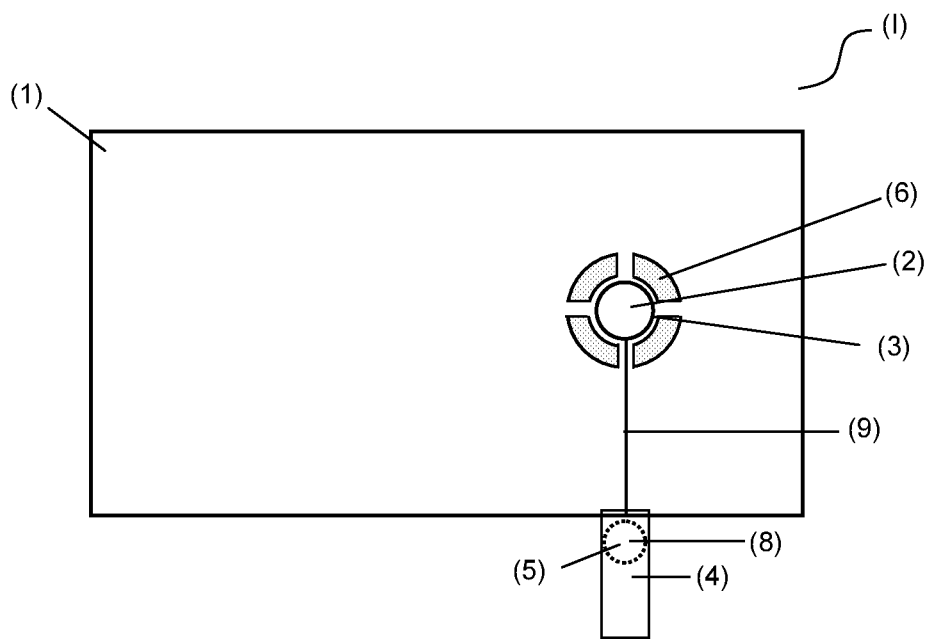
Figure 3:
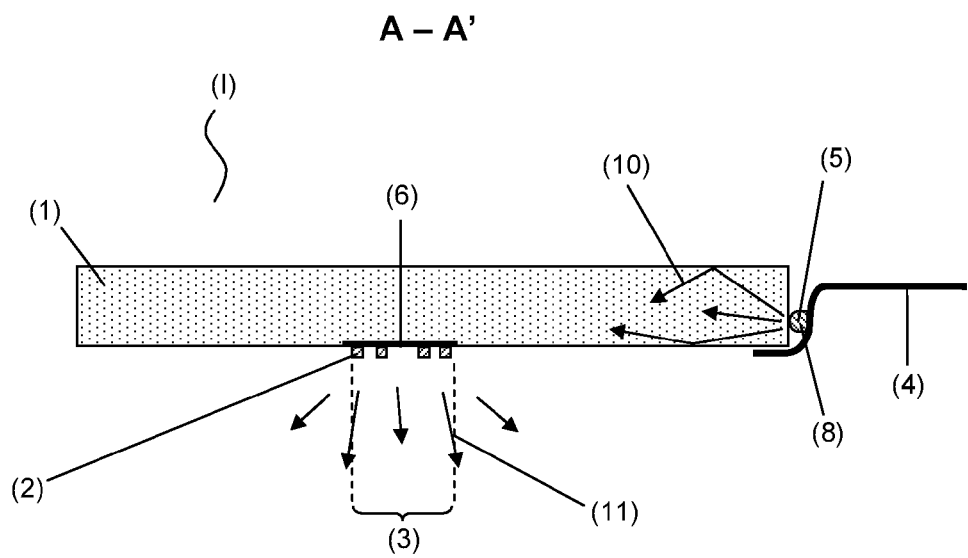
Figure 4:
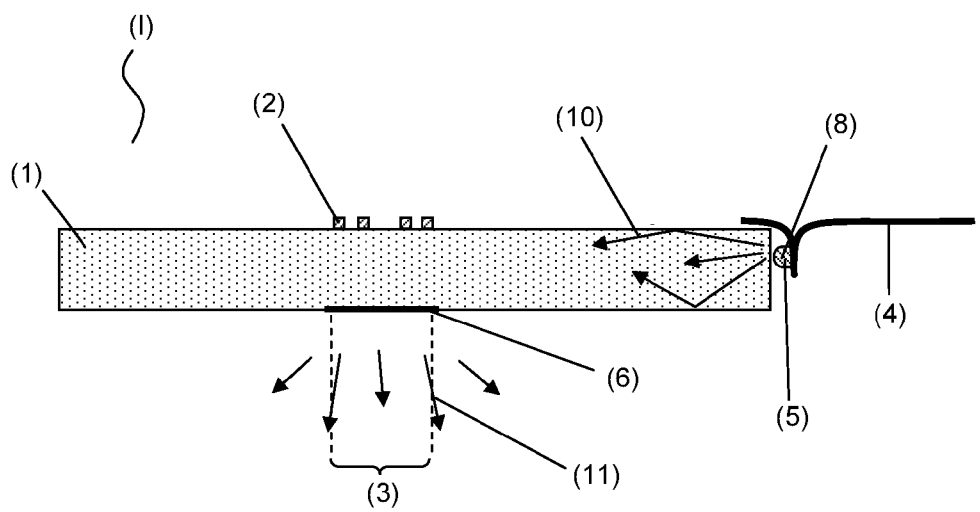
Figure 5:
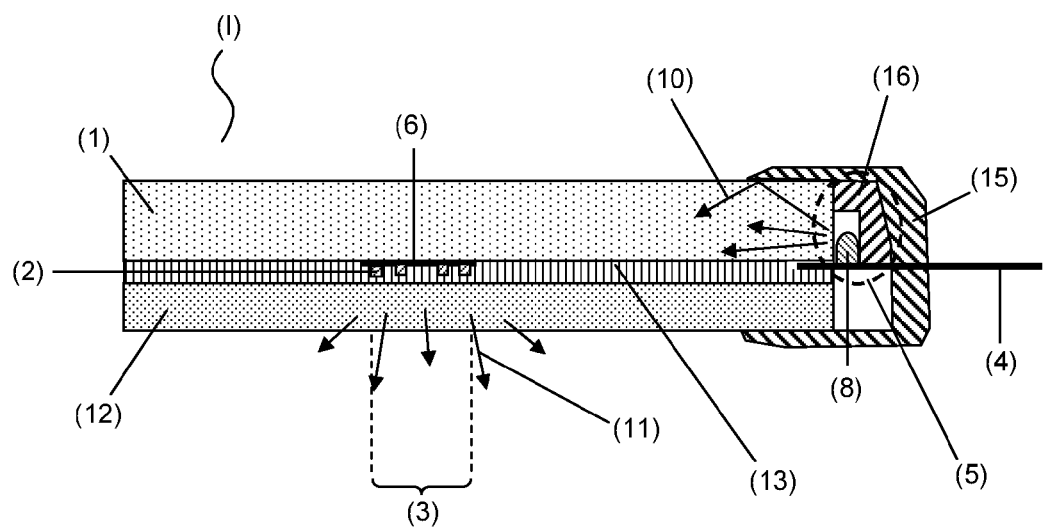
Figure 6:
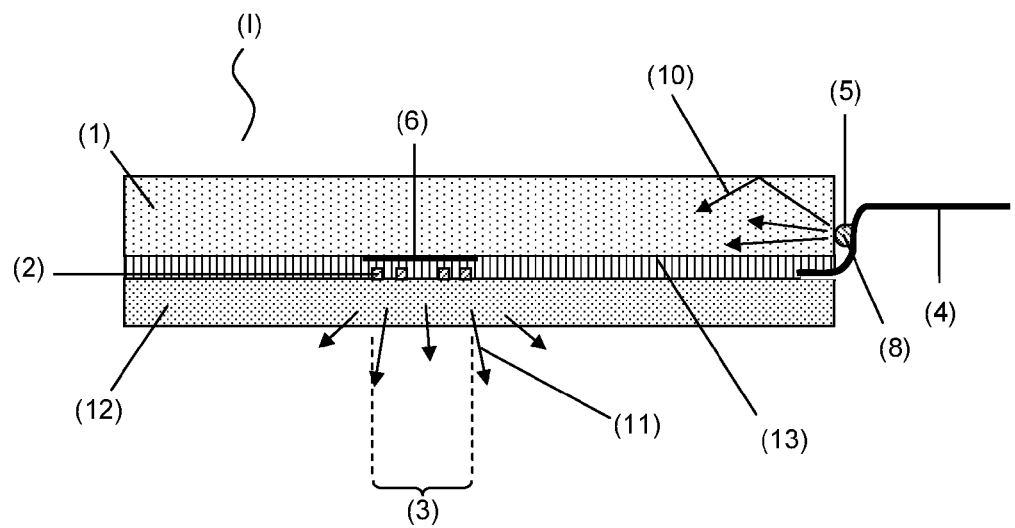
Figure 7:
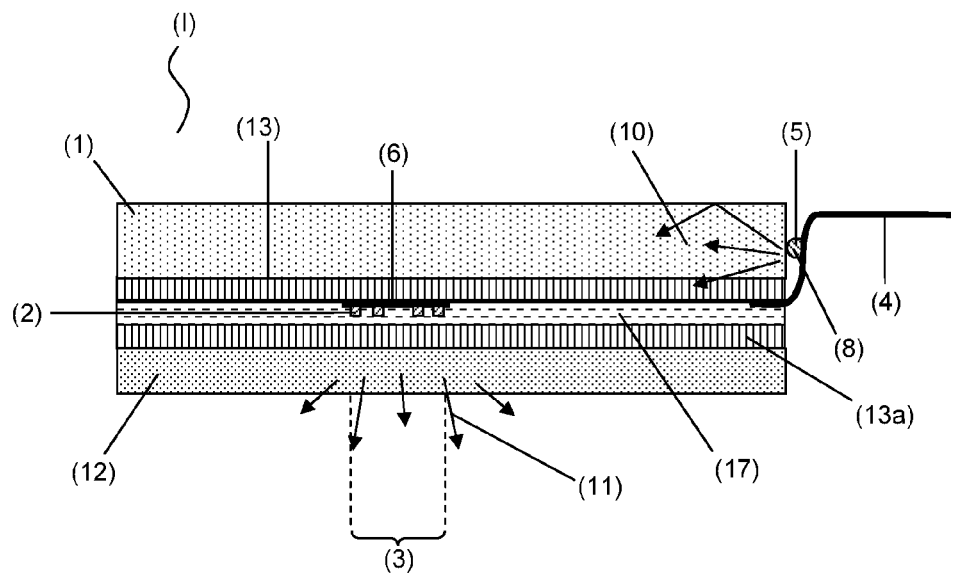
Figure 8:
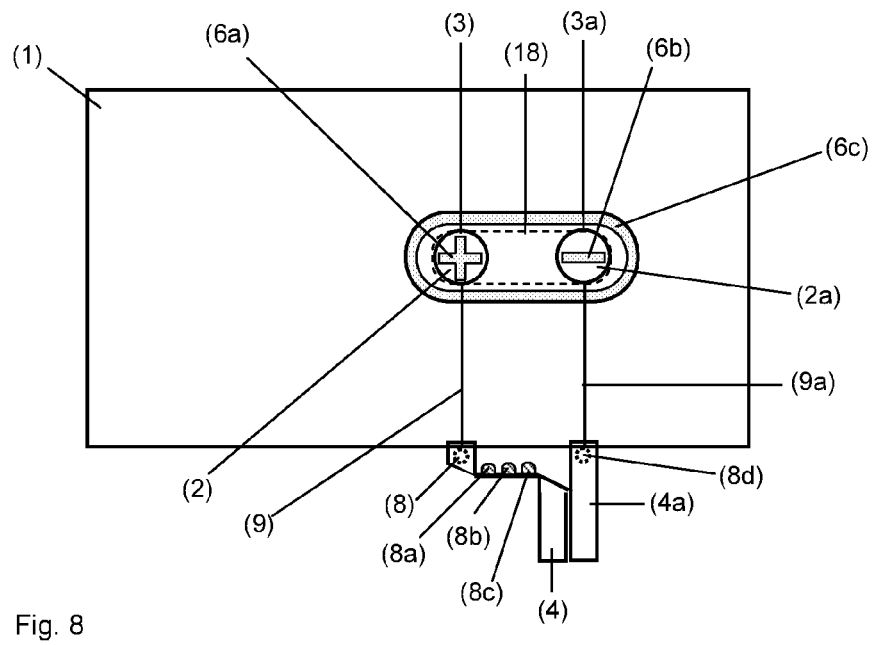
Figure 9:
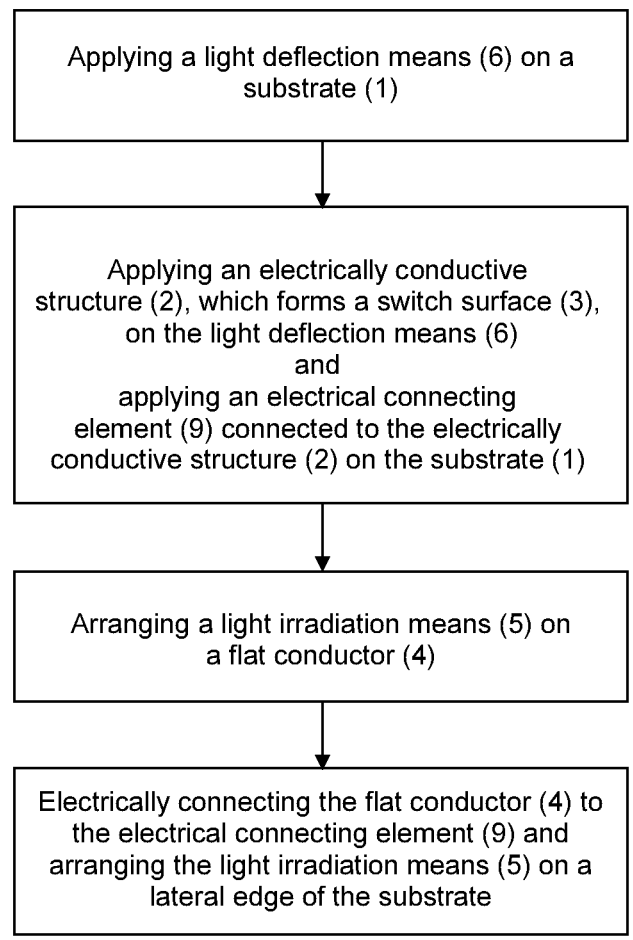
Figure 10:
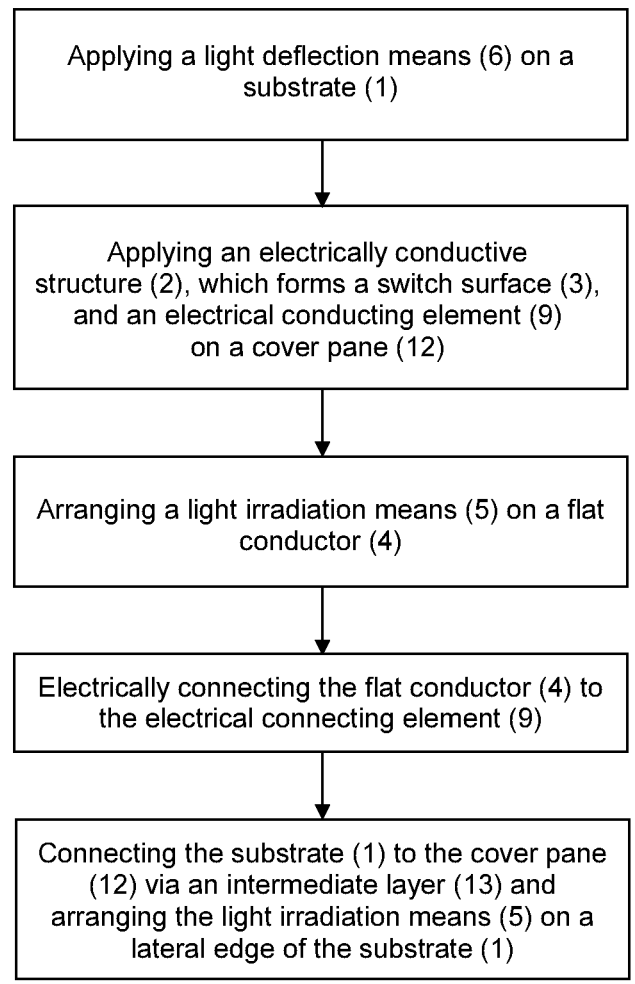
Figure 11:
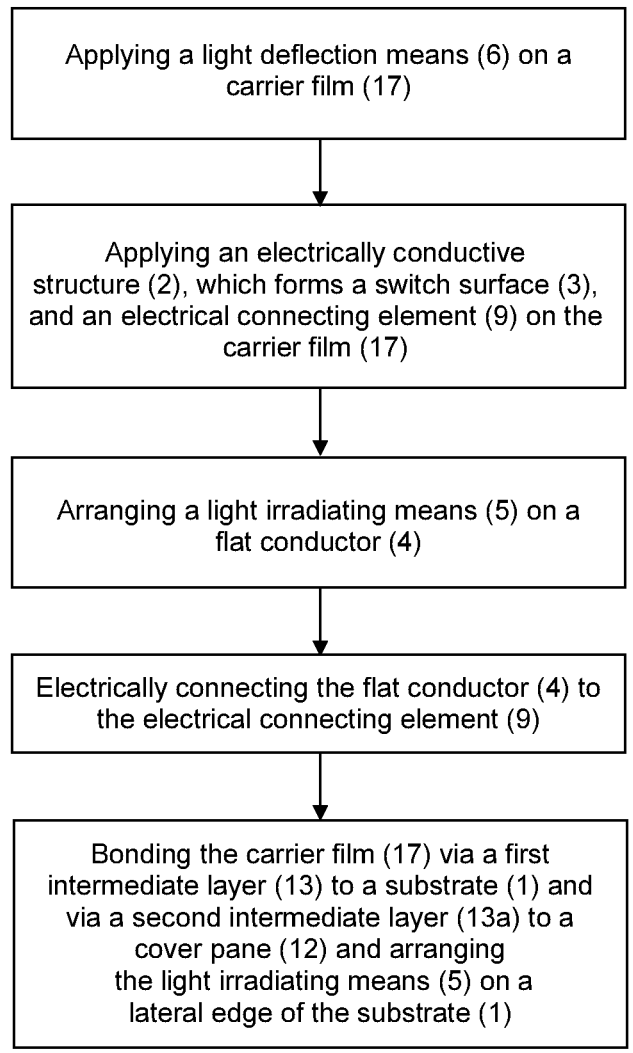

The invention is explained in detail with reference to drawings and exemplary embodiments. The drawings are schematic depictions and not true to scale. The drawings in no way restrict the invention. They depict:

FIG. 1 a top plan view of a first embodiment of the pane according to the invention having an illuminated switch surface, FIG. 2 a top plan view of another embodiment of the pane according to the invention having an illuminated switch surface, FIG. 3 a cross-section A-A' through the pane of FIG. 1, FIG. 4 a cross-section A-A' through another embodiment of the pane according to the invention, FIG. 5 a cross-section A-A' through another embodiment of the pane according to the invention, FIG. 6 a cross-section A-A' through another embodiment of the pane according to the invention, FIG. 7 a cross-section A-A' through another embodiment of the pane according to the invention, FIG. 8 a top plan view of another embodiment of the pane according to the invention, FIG. 9 an exemplary embodiment of the method according to the invention with reference to a flowchart, FIG. 10 another exemplary embodiment of the method according to the invention with reference to a flowchart, FIG. 11 another exemplary embodiment of the method according to the invention with reference to a flowchart.

FIG. 1 and FIG. 3 depict in each case a detail of a pane according to the invention (I) having an illuminated switch surface. The substrate 1 is a thermally prestressed single pane safety glass made of soda lime glass. The substrate 1 has a height of 1 m, a width of 2.5 m, and a thickness of 5 mm.

A light deflection means 6 is applied on a surface of the substrate 1. The light deflection means 6 is implemented as a roughened indentation and shaped as a completely filled in square with an edge length of 6 cm.

An electrically conductive structure 2 is arranged on the light deflection means 6. The electrically conductive structure 2 is a silver print with a thickness of 10 μm, which forms two electrodes with a width of 1 mm separated from each other. The electrodes are arranged meanderingly around each other with a distance between them of 1 mm and capacitively coupled to each other.

An electrical connecting element 9 runs from each of the two electrodes formed by the electrically conductive structure 2 to the lower lateral edge of the substrate 1. The electrical connecting elements 9 are soldered in the edge region of the substrate 1 to a flat conductor 4. The flat conductor 4 comprises two electrically conductive cores separated from each other in a common electrically insulating sheathing. The two electrical connecting elements 9 are connected in each case to one electrically conductive core of the flat conductor 4. The electrically conductive structure 2 is connected to an external power supply and control electronics (not shown) by the flat conductor 4 and the electrical connecting elements. When a body, for example, a human finger, approaches the electrically conductive structure 2, the capacitance of the condenser formed by the electrically conductive structure 2 changes. The control electronics can measure the change in capacitance and trigger a switching signal when a threshold value is exceeded. The electrically conductive structure 2 thus forms a switch surface 3. The switch surface 3 is shaped according to the arrangement of the electrically conductive structure 2 roughly square with a side length of 5 cm.

The square area that results from the projection of the light deflection means 6 onto the plane of the switch surface 3 and the square switch surface 3 have the same center. The area that results from the projection of an internal square region of the light deflection means 6 with a side length of 5 cm onto the plane of the switch surface 3 is arranged within the switch surface 3 and completely fills it. The area that results from the projection of the edge region of the light deflection means 6 onto the plane of the switch surface 3 borders the switch surface 3 continuously with a width of 0.5 cm.

In an alternative embodiment, the light deflection means 6 can have the same surface area as the switch surface 3 or a smaller surface area than the switch surface 3. For example, the light deflection means 6 can be shaped as a square with a side length of 5 cm or with a side length of 4 cm. In this case, the area that results from the projection of the light deflection means 6 onto the plane of the switch surface 3 is arranged completely within the switch surface 3.

A light irradiation means 5 is arranged on the side of the flat conductor 4 facing the substrate 1. The light irradiation means 5 comprises an LED as light source 8. The flat conductor 4 is bent such that the region of the flat conductors 4, on which the light source 8 is applied is arranged roughly perpendicular to the surface of the substrate 1. The flat conductor 4 with the light source 8 can be fixed in the position depicted, for example, by a transparent adhesive or by a frame around the pane (I). Thus, the light 10 of the light source 8 is efficiently coupled into the substrate 1 via the lateral edge of the substrate 1. The coupled-in light 10 is reflected from the inner surfaces of the substrate 1 according to the principle of total reflection into the interior of the substrate 1. Light 10 that strikes the light deflection means 6 is scattered on the light deflection means 6 and leaves the substrate 1. By means of the scattered light 11, the region of the light deflection means 6 appears to an observer as a lighted surface of that marks the position of the switch surface 3.

In an alternative embodiment of the invention, the light deflection means 6, for example, in the form of a sticker, can be arranged on the surface of the electrically conductive structure 2 facing away from the substrate 1.

FIG. 2 depicts a top plan view of an alternative embodiment of the pane according to the invention (I). The electrically conductive structure 2 forms a plate electrode, which is shaped as a circle with a radius of 4 cm. The electrically conductive structure 2 is electrically connected via an electrical connecting element 9 to the flat conductor 4. External control electronics that are connected to the flat conductor 4 can measure a change in capacitance of the plate electrode against ground, which is, for example, caused by the approach of a finger.

The light deflection means 6 is formed as an interrupted circular edge. The circular edge has a maximum radius of 5 cm and a width of 1 cm. The area that results from the projection of the light deflection means 6 onto the plane of the switch surface 3 borders the switch surface 3 formed by the electrically conductive structure 2. Light 11 scattered on the light deflection means 6 appears to the observer as an interrupted lighted circle, wherein to trigger a switch operation, for example, a finger must be brought into proximity with the region of the substrate 1 delimited by the lighted circle. The switch surface 3 is thus identified by the light deflection means 6.

FIG. 3 depicts a cross-section along A-A' through the pane according to the invention (I) according to FIG. 1.

FIG. 4 depicts a cross-section A-A' through an alternative embodiment of the pane according to the invention (I). The electrically conductive structure 2 and the light deflection means 6 are arranged on opposite sides of the substrate 1. The flat conductor 4 is bent, such that the region of the flat conductors 4, onto which the light source 8 is applied, its arranged roughly perpendicular to the surface of the substrate 1. Thus, the light 10 of the light source 8 is efficiently coupled via the lateral edge of the substrate 1 into the substrate 1.

FIG. 5 depicts a cross-section A-A' through another alternative embodiment of the pane according to the invention (I). The substrate 1 is a 3-mm-thick soda lime glass and has a height of 1 m and a width of 2.5 m. The electrically conductive structure 2, the electrical connecting element 9, and the light deflection means 6 are shaped in accordance with FIG. 3 and arranged on the substrate 1. The substrate 1 is bonded by a 0.76-mm-thick thermoplastic intermediate layer 13 to a cover pane 12 to form a laminated safety glass. The bonding of the substrate 1 to the cover pane 12 is done via the surface of the substrate 1, on which the electrically conductive structure 2 and the light deflection means 6 are arranged. Thus, the electrically conductive structure 2, the electrical connecting element 9, and the light deflection means 6 are advantageously protected against damage, for example, by means of mechanical abrasion on touching or corrosion. The intermediate layer 13 contains polyvinyl butyral (PVB). The cover pane 12 is a 2.1-mm-thick soda lime glass.

The light irradiation means 5 comprises an LED as light source 8 and a reflector 16. The region of the flat conductor 4, on which the light irradiation means 5 is arranged, is arranged roughly parallel to the surface of the substrate. Thus, the flat conductor 4 can be guided away from the pane (I) without bending or folding. This is particularly advantageous with regard to the prevention of damage to the flat conductor 4. By means of the reflector 16, the light 10 of the light source 8 is efficiently coupled into the pane (I) via the lateral edge of the substrate 1.

The edge region of substrate 1 and cover pane 12 and the light irradiation means 5 are surrounded by a frame element 15. The frame element 15 in the region of the light irradiation means 5 is preferably separated from the rest of the frame around the pane (I) and is independently removable. This is particularly advantageous with regard to simple attachment and maintenance of the light irradiation means. Light source 8 and/or reflector 16 can be easily replaced in the event of damage.

FIG. 6 depicts a cross-section A-A' through another alternative embodiment of the pane according to the invention (I). The substrate 1 is bonded by the intermediate layer 13 to the cover pane 12 to form a laminated safety glass. The light deflection means 6 is arranged on the surface of the substrate 1 facing the cover pane 12. The electrically conductive structure 2 and the electrical connecting element 9 (not shown in the cross-section) are arranged on the surface of the cover pane 12 facing the substrate 1. The light deflection means 6, the electrically conductive structure 2, and the electrical connecting element 9 are thus advantageously protected against damage from external influences.

In an alternative embodiment, the electrically conductive structure 2 and the electrical connecting element 9 can be arranged on the surface of the cover pane 12 facing away from the substrate 1.

In another alternative embodiment, the light deflection means 6 can be arranged on the cover pane 12. The substrate 1 and the cover pane 12 have a refractive index of roughly 1.55. The PVB-containing intermediate layer 13 has a refractive index of roughly 1.49. Due to the small difference between the refractive indices of the substrate 1, the intermediate layer 13, and the cover pane 12, the coupled-in light 10 is not totally reflected on the boundary surface inside the pane (I) and, consequently, irradiates the substrate 1, the intermediate layer 13, and the cover pane 12.

FIG. 7 depicts a cross-section A-A' through another alternative embodiment of the pane according to the invention (I). The electrically conductive structure 2, the electrical connecting element 9 (not shown in the cross-section), and the light deflection means 6 are arranged on a carrier film 17. The carrier film 17 contains polyethylene terephthalate (PET) and has a thickness of 0.2 mm. The carrier film 17 is arranged between a first intermediate layer 13 and a second intermediate layer 13a. The substrate 1 is bonded to the cover pane 12 by the first intermediate layer 13, the carrier film 17, and the second intermediate layer 13a. At the time of production of the laminated glass, the electrically conductive structure 2, the electrical connecting element 9, and the light deflection means 6 can be positioned together simply by means of the carrier film 17 at the intended location for the surface switch 3.

FIG. 8 depicts a top plan view of another alternative embodiment of the pane according to the invention (I). Two electrically conductive structures 2 and 2a are applied on the substrate 1. The two electrically conductive structures 2, 2a are applied on the same surface of the substrate 1. Each electrically conductive structure 2, 2a forms a plate electrode and is electrically connected to a flat conductor 4, 4a via a connecting element 9, 9a.

A switch surface 3, 3a is formed by each electrically conductive structure 2, 2a. The two switch surfaces 3, 3a are provided for the purpose of triggering functions complementary to each other with the proximity of a body. For example, the transparency of an electrochromic coating can be controlled via the switch surfaces 3, 3a, with the touching of the switch surface 3 causing a reduction in the transparency and the touching of the switch surface 3a causing an increase in the transparency. Due to the complementary functions, the two switch surfaces 3, 3a and the region of the pane (I) situated between them should be identified as switch field 18.

The light deflection means 6 comprises three regions 6a, 6b and 6c separated from each other. The region 6a of the light deflection means 6 is shaped as a "Plus" sign. The area that results from the projection of the region 6a of the light deflection means 6 onto the plane of the switch surfaces 3, 3a is arranged completely within the switch surface 3. The region 6b of the light deflection means 6 is shaped as a "Minus" sign. The area that results from the projection of the region 6b of the light deflection means 6 onto the plane of the switch surfaces 3, 3a is arranged completely within the switch surface 3a. The region 6c of the light deflection means 6 is shaped as an unfilled rectangle with two semicircles arranged on opposite sides. The area that results from the projection of the region 6c of the light deflection means 6 onto the plane of the switch surfaces 3, 3a borders the switch field 18 continuously.

An LED is arranged on the flat conductor 4a as light source 8d. Four LEDs are arranged one after another on the flat conductor 4 as light sources 8, 8a, 8b, 8c. In the region of the light sources 8a, 8b and 8c, the flat conductor 4 is guided along on the lateral edge of the substrate 1 in the direction of the flat conductors 4a, with the light 10 of the light sources 8a, 8b, 8c coupled into the pane (I). Thus, even the region of the pane (I) between the switch surfaces 3, 3a and, with it, the region 6c of the light deflection means 6 is irradiated with light.

In an alternative embodiment of the invention, a single light source 8 and an optical waveguide, into which the light of the light source 8 is coupled, can be arranged on the flat conductor 4. In the region of the optical waveguide, the flat conductor 4 is guided along on the lateral edge of the substrate 1. By means of the optical waveguide, a larger region of the pane (I) can be irradiated with light than by a single light source.

FIG. 9 depicts a flowchart of an exemplary embodiment of the method according to the invention for producing a pane (I) having an illuminated switch surface as single-pane safety glass.

FIG. 10 depicts a flowchart of an exemplary embodiment of the method according to the invention for producing a pane (I) having an illuminated switch surface as laminated safety glass. In the exemplary embodiment, the light deflection means 6 is arranged on the substrate 1. The electrically conductive structure 2 and the electrical connecting element 9 are arranged on the cover pane 12. The positioning of the light deflection means 6 and the electrically conductive structure 2 must be selected such that, after the bonding of the substrate 1 and the cover pane 12, the area that results from the projection of the light deflection means 6 onto the plane of the switch surface 3 is arranged within the switch surface 3 and/or borders the switch surface 3 continuously or interruptedly.

FIG. 11 depicts a flowchart of an exemplary embodiment of the method according to the invention for producing a pane (I) having an illuminated switch surface as laminated safety glass, wherein the light deflection means 6, the electrically conductive structure 2, and the electrical connecting element 9 are arranged on a carrier film 17.

With all test specimens produced, the position of the switch surface 3 in the dark was clearly and uniquely identified by light coupled via the lateral edge of the substrate 1 into the pane (I) and scattered on the light deflection means 6. It was unexpected and surprising for the person skilled in the art that marking of the switch surface 3 can be provided in a simple and reliable manner.

LIST OF REFERENCE CHARACTERS (I) pane according to the invention having an illuminated switch surface
(1) transparent substrate
(2) electrically conductive structure
(2*a*) electrically conductive structure
(3) switch surface
(3*a*) switch surface
(4) flat conductor
(4*a*) flat conductor
(5) light irradiation means
(6) light deflection means
(6*a*) region of the light deflection means 6
(6*b*) region of the light deflection means 6
(6*c*) region of the light deflection means 6
(8) light source (LED)
(8*a*) light source (LED)
(8*b*) light source (LED)
(8*c*) light source (LED)
(8*d*) light source (LED)
(9) electrical connecting element
(9*a*) electrical connecting element
(10) light coupled into the pane (I)
(11) light scattered on the light deflection means 6
(12) cover pane
(13) intermediate layer
(13*a*) intermediate layer
(15) frame element
(16) reflector
(17) carrier film
(18) switch field
A-A' section line

The invention claimed is:

1. A pane having an illuminated switch surface, comprising:
   a transparent substrate,
   an electrically conductive structure, which forms the illuminated switch surface,
   a flat conductor on a lateral edge of the transparent substrate, which is electrically connected to the electrically conductive structure via an electrical connecting element,
   a light irradiation means, which comprises at least one light source and is arranged on the flat conductor and on the lateral edge of the transparent substrate, wherein light is coupled into the pane from the lateral edge of the transparent substrate, and
   a light deflection means, which is arranged in the region of the pane irradiated by the light of the light irradiation means,
   wherein:
   an area that results from a projection of the light deflection means onto the plane of the switch surface is arranged within the switch surface, or borders the switch surface continuously or interruptedly, or is both arranged within the switch surface and borders the switch surface continuously or interruptedly, and the light deflection means comprises structures for light scattering.

2. The pane according to claim 1, wherein the light deflection means comprises one or more of particles, point grids, stickers, deposits, indentations, scratches, line grids, imprints, or silkscreen prints.

3. The pane according to claim 1, wherein the substrate is connected to a cover pane by at least one intermediate layer and the intermediate layer contains at least one or more of polyvinyl butyral (PVB) and ethylene vinyl acetate (EVA).

4. The pane according to claim 1, wherein the electrically conductive structure and the light deflection means are arranged on the same surface or on surfaces of the substrate opposite one another.

5. The pane according to claim 3, wherein the electrically conductive structure and the light deflection means are arranged on the same surface or on surfaces of the cover pane opposite one another.

6. The pane according to claim 3, wherein the electrically conductive structure is arranged on a surface of the substrate and the light deflection means is arranged on a surface of the cover pane.

7. The pane according to claim 3, wherein the electrically conductive structure is arranged on a surface of the cover pane and the light deflection means is arranged on a surface of the substrate.

8. The pane according to claim 3, wherein at least one of the electrically conductive structure or the light deflection means is arranged on a carrier film between a first intermediate layer and a second intermediate layer.

9. The pane according to claim 8, wherein the carrier film contains at least one polyester, at least one polyimide, or at least one polyester and at least one polyimide, and has a thickness from 10 µm to 1 mm.

10. The pane according to claim 9, wherein the carrier film contains a thermoplastic polyester.

11. The pane according to claim 10, wherein the thermoplastic polyester is polyethylene naphthalate, or polyethylene terephthalate.

12. The pane according to claim 9, wherein the thickness is from 30 µm to 200 µm.

13. The pane according to claim 1, wherein the area of the surface that results from a projection of the light deflection means onto the plane of the switch surface is from 5% to 300% of an area of the switch surface.

14. The pane according to claim 13, wherein the area of the surface that results from a projection of the light deflection means onto the plane of the switch surface is from 10% to 200% of an area of the switch surface.

15. The pane according to claim 1, wherein the light irradiation means comprises a reflector or an optical waveguide or both.

16. A motor vehicle comprising the pane having an illuminated switch surface according to claim 1.

17. The pane according to claim 1, wherein the flat conductor attaches to a lower corner of the lateral edge of the substrate.

18. The pane according to claim 1, wherein the flat conductor comprises a first part substantially parallel to a main surface of the substrate and not touching the substrate, a second part attached to an upper or lower corner of the lateral edge of the substrate, and a third curved part connecting the first part to the second part.

19. A method for producing a pane having an illuminated switch surface, comprising:

applying an electrically conductive structure, which forms a switch surface, an electrical connecting element connected to the electrically conductive structure, and a light deflection means on a transparent substrate, and arranging a light irradiation means on a flat conductor and electrically connecting the flat conductor to the electrical connecting element, wherein the light irradiation means and the flat conductor are arranged on a lateral edge of the transparent substrate.

20. The method according to claim 19, wherein the flat conductor is electrically connected to the electrical connecting element by soldering, clamping, or by means of an electrically conductive adhesive.

21. A method for producing a pane having an illuminated switch surface, comprising:

applying an electrically conductive structure, which forms a switch surface, and an electrical connecting element connected to the electrically conductive structure on a transparent substrate or on a cover pane and applying a light deflection means on the transparent substrate or on the cover pane, arranging a light irradiation means on a flat conductor and electrically connecting the flat conductor to the electrical connecting element, and bonding the substrate to the cover pane by at least one intermediate layer under the action of heat, vacuum, pressure, or a combination thereof, wherein the light irradiation means and the flat conductor are arranged on a lateral edge of the transparent substrate.

22. A method for producing a pane having an illuminated switch surface, comprising:

applying an electrically conductive structure, which forms a switch surface, an electrical connecting element connected to the electrically conductive structure, and a light deflection means on a carrier film, arranging a light irradiation means on a flat conductor and electrically connecting the flat conductor to the electrical connecting element, and bonding the carrier film to a substrate by a first intermediate layer and to a cover pane by a second intermediate layer under the action of heat, vacuum, pressure, or combination thereof, wherein the light irradiation means and the flat conductor are arranged on a lateral edge of the substrate.

* * * * *